United States Patent
Huang et al.

(10) Patent No.: US 9,640,498 B1
(45) Date of Patent: May 2, 2017

(54) INTEGRATED FAN-OUT (INFO) PACKAGE STRUCTURES AND METHODS OF FORMING SAME

(71) Applicant: Taiwan Semiconductor Manufacturing Company, Ltd., Hsin-Chu (TW)

(72) Inventors: Chang-Pin Huang, Yangmei Township (TW); Chen-Hua Yu, Hsin-Chu (TW); Ching-Jung Yang, Pingzhen (TW); Chung-Shi Liu, Hsin-Chu (TW); Hsien-Ming Tu, Zhubei (TW); Hung-Yi Kuo, Taipei (TW); Hao-Yi Tsai, Hsin-Chu (TW); Shih-Wei Liang, Dajia Township (TW); Yu-Chia Lai, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/918,256

(22) Filed: Oct. 20, 2015

(51) Int. Cl.
*H01L 23/48* (2006.01)
*H01L 23/52* (2006.01)
*H01L 23/00* (2006.01)
*H01L 23/31* (2006.01)
*H01L 23/29* (2006.01)
*H01L 21/56* (2006.01)

(52) U.S. Cl.
CPC ............ *H01L 24/08* (2013.01); *H01L 21/565* (2013.01); *H01L 23/293* (2013.01); *H01L 23/3157* (2013.01); *H01L 24/03* (2013.01); *H01L 24/10* (2013.01); *H01L 2224/0231* (2013.01); *H01L 2224/02379* (2013.01)

(58) Field of Classification Search
CPC ... H01L 2224/02379; H01L 2224/2517; H01L 2224/40108; H01L 2224/41171; H01L 2924/181; H01L 2224/32225; H01L 2224/97; H01L 2224/16225; H01L 23/5389; H01L 24/96; H01L 2924/18162; H01L 2224/0239; H01L 2224/82; H01L 23/3114; H01L 2224/1171
See application file for complete search history.

(56) References Cited

U.S. PATENT DOCUMENTS

| | | | |
|---|---|---|---|
| 8,354,739 B2 * | 1/2013 | Su | H01L 21/568 257/666 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |

(Continued)

*Primary Examiner* — Roy Potter
(74) *Attorney, Agent, or Firm* — Slater Matsil, LLP (57) ABSTRACT

An embodiment method includes providing a carrier having a recess and attaching a die to the carrier, wherein the die is at least partially disposed in the recess. The method further includes forming a molding compound over the carrier and around at least a portion of the die, forming fan-out redistribution layers over the molding compound and electrically connected to the die, and removing the carrier.

20 Claims, 7 Drawing Sheets

(56) References Cited

U.S. PATENT DOCUMENTS

| | | |
|---|---|---|
| 8,877,554 B2 | 11/2014 | Tsai et al. |
| 9,257,393 B1 * | 2/2016 | Gong .................. H01L 23/3114 |
| 2010/0140788 A1 * | 6/2010 | Jin .................... H01L 23/49811 |
| | | 257/695 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

* cited by examiner

INTEGRATED FAN-OUT (INFO) PACKAGE STRUCTURES AND METHODS OF FORMING SAME

BACKGROUND

In an aspect of conventional packaging technologies, such as integrated fan-out (InFO) wafer level packaging (WLP), redistribution layers (RDLs) may be formed over a die and electrically connected to active devices in a die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, a molding compound may be formed around the die to provide surface area to support the fan-out interconnect structures. For example, RDLs typically include one or more polymer layers formed over the die and molding compound. Conductive features (e.g., conductive lines and/or vias) are formed in the polymer layers and electrically connect I/O pads on the die to the external I/O pads over the RDLs. The external I/O pads may be disposed over both the die and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include using a patterned carrier for supporting semiconductor device dies while forming package features such as a molding compound and fan-out redistribution layers (RDLs). The patterned carrier includes a plurality of recesses securing the device dies during various processing steps (e.g., molding). A size of each recess is based on a size of a device die placed within the recess. After various features of the package are formed, the carrier may be removed, and a bottom surface of the die may extend past a bottom surface of the molding compound. The use of a patterned carrier and the resulting package structure may provide various non-limiting advantages. For example, each recess in the patterned carrier may have similar dimensions as a device die in a plan view. By using the recesses to help maintain a position of the device dies during molding, die shifting during the molding process may be reduced. Thus, alignment between the dies and subsequently formed RDLs can be improved, which reduces manufacturing defects and allows for RDL designs having smaller buffer areas and finer pitch. Additionally, less molding compound may be dispensed to form the device package, which allows for reduced coefficient of thermal expansion (CTE) mismatch and warpage in the resulting package. Furthermore, by extending bottom surfaces of the dies past a bottom surface of the molding compound, improved heat dissipation in the resulting packaged device can be achieved.

Figure 1:
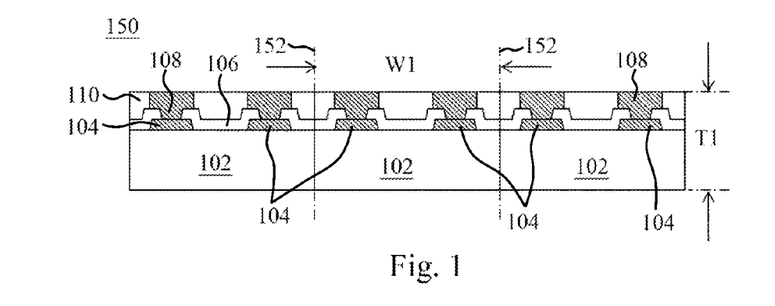
FIGS. 1 through 8 illustrate various intermediary stages of manufacturing a semiconductor device in accordance with some embodiments.

FIG. 1 illustrates a cross-sectional view of dies 102. Each die 102 may include a semiconductor substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On- Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connect various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Input/output (I/O) and passivation features may be formed over the interconnect structure. For example, contact pads 104 may be formed over the interconnect structure and may be electrically connected to the active devices through the various conductive features in the interconnect structure. Contact pads 104 may comprise a conductive material such as aluminum, copper, and the like. Furthermore, a passivation layer 106 may be formed over the interconnect structure and the contact pads. In some embodiments, passivation layer 106 may be formed of non-organic materials such as silicon oxide, un-doped silicate glass, silicon oxynitride, and the like. Other suitable passivation materials may also be used. Portions of passivation layer 106 may cover edge portions of the contact pads 104.

Additional interconnect features, such as additional passivation layers, conductive pillars, and/or under bump metallurgy (UBM) layers, may also be optionally formed over contact pad 104. For example, as illustrated by FIG. 1, conductive pillars 108 may be formed on and electrically connect to contact pads 104, and a dielectric layer 110 may be formed around such conductive pillars 108. The various features of dies 102 may be formed by any suitable method and are not described in further detail herein. Furthermore, the general features and configuration of dies 102 described above are but one example embodiment, and dies 102 may include any combination of any number of the above features as well as other features.

In an example embodiment, dies 102 have a thickness T1 (e.g., measured from a top surface to a bottom surface) of about 450 μm and a width W1 (e.g., measured from a left sidewall to a right sidewall) of about 5 mm. For example, each die 102 may be configured as a 5 mm by 5 mm rectangle in a top down view (see e.g., FIGS. 4B to 4C). In other embodiments, dies 102 may have different dimensions and/or a different shape.

Although described as a die 102 throughout, one of ordinary skill will readily understand that some processing on die 102 may occur while die 102 is part of a larger substrate, for example, a wafer 150 as illustrated by FIG. 1. After formation, die 102 may be singulated from other structures (e.g., other dies 102) in the wafer along scribe lines 152, for example.

Figure 2:
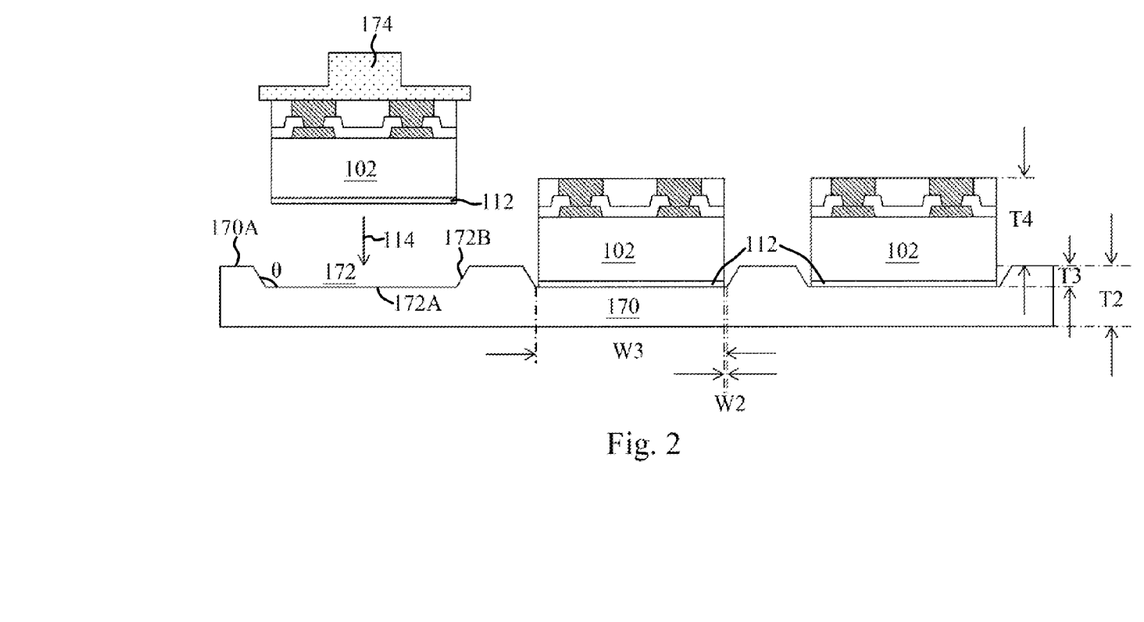
Figure 8:
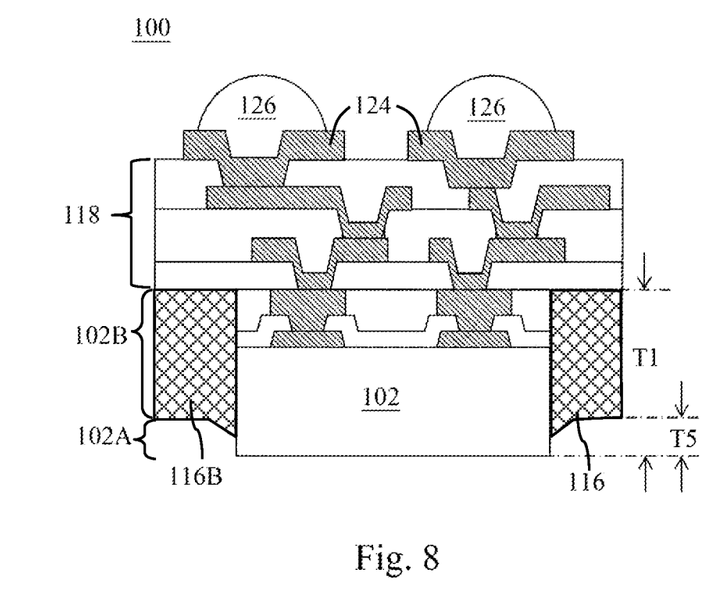

After singulation, dies 102 are attached to a carrier 170 for further processing to form various features of a device package 100 (see FIG. 8). FIG. 2 illustrates a cross-sectional view of carrier 170. Generally, carrier 170 provides temporary mechanical and structural support to dies 102 during subsequent processing steps. In this manner, damage to dies 102 are reduced or prevented. Carrier 170 has a total thickness T2 of about 550 μm in an embodiment although carriers having another thickness may be used as well. Carrier 170 may comprise, for example, glass, silicon oxide, aluminum oxide, and the like, and carrier 170 may be patterned to include recesses 172, which help secure dies 102 and reduce die shifting during subsequent processing (e.g., forming a molding compound, see FIGS. 4A through 4C). Recesses 172 may be patterned into carrier 170 prior to attaching dies 102 using any suitable process, such as etching, laser ablation, and the like.

In various embodiments, a size of each recess 172 may be configured in accordance with a size (e.g., footprint) of die 102 secured by the recess. In a top down view, a bottom surface 172A of recess 172 may be large enough to extend past sidewalls of dies 102 by a width W2 in all directions. In some embodiments, width W2 is about 5 μm or less. For example, in embodiments where dies 102 have width W1 of about 5 mm, a width W3 of bottom surface 172A of recess 172 may be about 5.001 mm. Furthermore, in embodiments where dies 102 are a 5 mm by 5 mm rectangle, bottom surface 172A of recess 172 may likewise be configured as a 5.001 mm by 5.001 mm rectangle. In other embodiments where dies 102 have a different size and/or shape, sizes and shapes of recesses 172 may also be changed accordingly. Furthermore, FIG. 2 illustrates identically-sized dies 102 being disposed within identically sized recesses 172. However, in other embodiments, multiple dies of varying sizes/shapes may be attached to a same carrier, and the recesses within the carrier may also have varying sizes/shapes according to the sizes of the dies. Thus, carrier 170 may be configured for a specific package/die configuration, and different carriers may be used for processing packages/dies of different configurations.

By providing recesses 172 having a size and shape based on the configuration of dies 102, each recess 172 may help secure a corresponding die 102 during subsequent processing and advantageously reduce lateral shifting of dies 102. Furthermore, recesses 172 are formed with a buffer area (e.g., a space between sidewalls of the recess and die 102) as described above (e.g., having the above dimensions) in order to ease the placement of dies 102 within recess 172 while still reducing lateral shifting of dies during subsequent processing. Including the buffer area may also reduce the risk of damage (e.g., chipping) to dies 102 that may occur from placement error.

Recess 172 may extend into carrier 170 to a depth T3, which may measure a distance between an upper surface 170A of carrier 170 to bottom surface 172A of recess 172. In an embodiment, depth T3 may be about 20% to about 50% of a thickness T1 of die 102 (see FIG. 1). For example, in an embodiment where dies 102 have a thickness of about 450 μm, recesses 172 may have a depth T3 of about 100 μm. In such embodiments, dies 102 may extend above top surface 170A of carrier 170 by a thickness T4, which may be about 350 μm.

Dies 102 to be placed within recesses 172 using a bond head 174 of a pick-and-place tool as indicated by arrow 114. In an embodiment, a die attach film (DAF) 112 may be used to secure dies 102 to bottom surfaces 172A of recesses 172. DAF 112 may be any suitable adhesive, such as an ultraviolet (UV) glue, which loses its adhesive property when exposed to UV lights. DAF 112 may be applied to each die 102 either before or after singulation from other features of wafer 150 (see FIG. 1). Furthermore, at least an upper portion of sidewalls 172B of recesses 172 may be sloped to facilitate alignment of dies 102 into recesses 172 as will be explained in greater detail below. In some embodiments, angle θ of sidewall 172B (e.g., an angle between sidewall 172B and bottom surface 172A of recess 172) may be about 45° to facilitate the self-alignment of dies 102 into recesses 172. In other embodiments, sidewalls 172B may be sloped at a different angle or substantially perpendicular to bottom surface 172A.

Figure 3A:
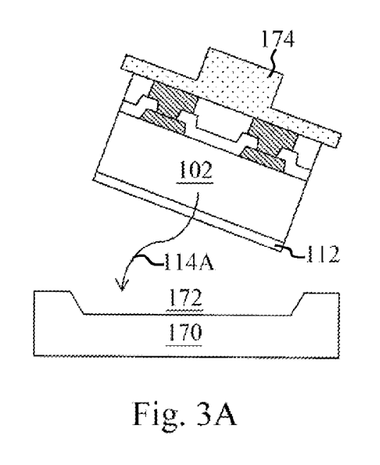
Figure 3B:
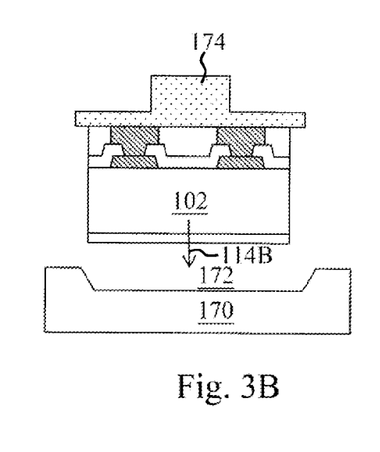

FIGS. 3A through 3B illustrate a detailed view of placing a die 102 into a recess 172 according to an embodiment. In FIG. 3A, a bond head 174 moves a die 102 towards a recess 172 of carrier 170 as indicated by arrow 114A. Die 102 may be secured by bond head 174 using any suitable mechanism, such as vacuum pressure applied by a vacuum (not explicitly illustrated) disposed within bond head 174, for example. As another example, die 102 may be positioned over recess 172 by a mechanical pick-and-place tool with a robot-hand mechanism, which contacts and secures sidewalls of die 102 during movement. Other mechanisms for positioning die 102 may also be used.

Figure 3C:
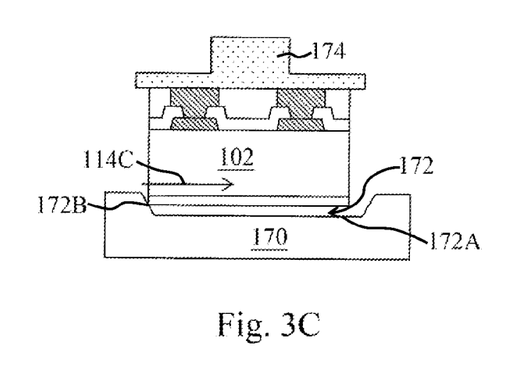
Figure 3D:
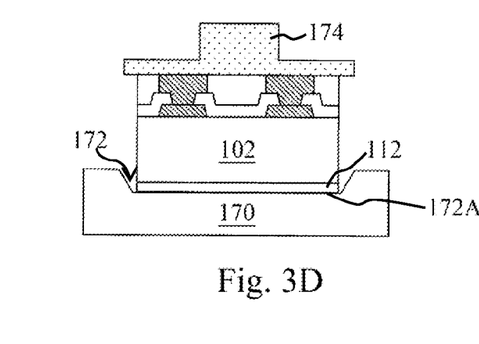

Once die 102 is aligned with recess 172, bond head 174 may lower die 102 into recess 174 as indicated by arrow 114B in FIG. 3B. However, control of bond head 174 may not be precisely accurate, and die 102 may be slightly misaligned with bottom surface 172A of recess 172. For example, a sidewall of die 102 may be positioned past bottom surface 172A when lowered by bond head 174 as illustrated by FIG. 3C. However, die 102 may slide laterally onto bottom surface 172A of recess 172 as indicated by arrow 114C because sidewalls 172B of recess 172 are sloped. For example, as discussed above, sidewalls 172B may be disposed at a 45° angle relative bottom surface 172A of recess 172. By providing sloped sidewalls 172B for recess 172, dies 102 may be positioned onto bottom surface 172A using self-alignment, which advantageously allows dies 102 to be positioned over recess 172 with reduced accuracy. FIG. 3D illustrates die 102 fully disposed within recess 172 and secured to carrier 170 by DAF 112. After dies 102 are placed on carrier 170, bond head 174 may be removed.

Figure 4A:
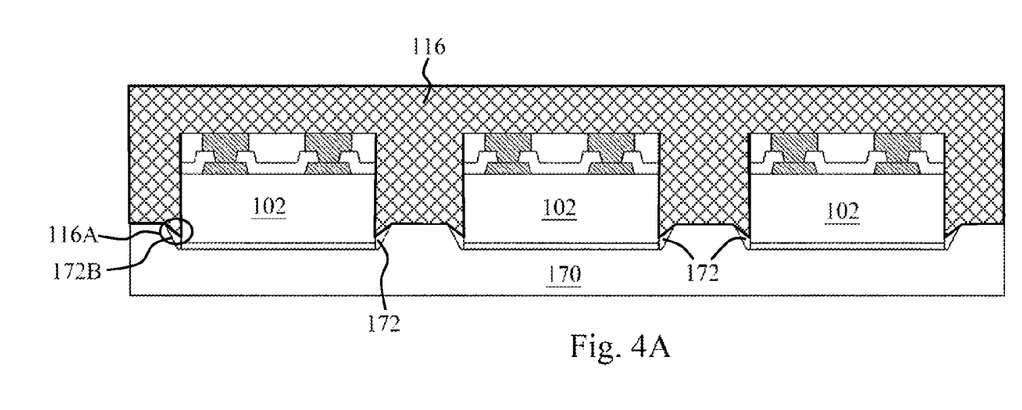

After dies 102 are positioned in recesses 172, a molding compound 116 may be formed around dies 102 as illustrated by FIG. 4A. Molding compound 116 may include any suitable material such as an epoxy resin, phenol resin, a thermally-set resin, and the like. In addition to these materials, molding compound 116 may or may not include various additive fillers, such as silicon oxide, aluminum oxide, boron nitride, and the like. Suitable methods for forming molding compound 116 may include compressive molding, transfer molding, liquid encapsulent molding, and the like. For example, molding compound 116 is shaped or molded using a molding tool (not illustrated) which may have a border or other feature for retaining molding compound 116 when applied. During application, dies 102 may be secured by recesses 172 to reduce lateral shifting of dies 102. The molding tool may be used to dispense molding compound 116 around dies 102 to force molding compound 116 into openings and recesses, eliminating air pockets or the like. Molding compound 116 may be dispensed around dies 102 in liquid form. Subsequently, a curing process is performed to solidify molding compound 116.

Figure 4B:
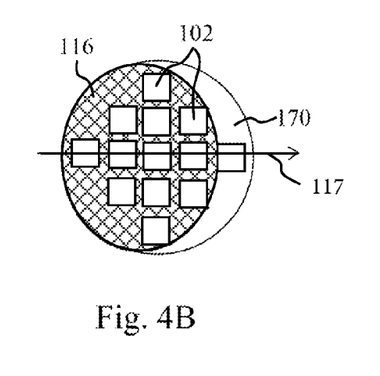
Figure 4C:
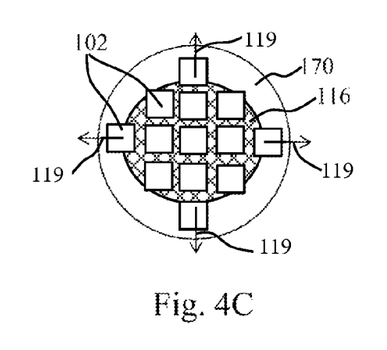

FIG. 4B illustrates a top-down view of carrier 170 and dies 102 during a transfer molding process. In the embodiment of FIG. 4B, molding compound 116 may be dispensed at one edge of carrier 170, and an appropriate tool (e.g., a vacuum) may be used to draw molding compound 116 across carrier 170 as indicated by arrow 117. FIG. 4C illustrates a top-down view of carrier 170 and dies 102 during a compressive molding process. In the embodiment of FIG. 4C, molding compound 116 may be dispensed at the center of carrier 170, and an appropriate tool (e.g., a mold chase) apply pressure to molding compound 116 and force molding compound 116 to edges of carrier 170 as indicated by arrows 119.

Referring back to FIG. 4A, recesses 172 include buffer areas (e.g., areas between sidewalls 172B of recesses 172 and dies 102), and portions of molding compound 116 (e.g., portion 116A) may also extend partially into recesses 172 (e.g., into these buffer areas) along sidewalls of dies 102 in an embodiment. However, due to the relatively small dimensions of these buffers areas, molding compound 116 may not completely fill these buffer areas or extend to a bottom surface of die 102 in an embodiment. For example, in embodiments where molding compound comprises additive fillers, the size of the fillers may be larger than the buffer areas of recess 172. Thus, these fillers may prevent molding compound 116 from filling these buffer areas. As further illustrated by FIG. 4A, sidewalls 172B of recess 172 are sloped, and portions 116A of molding compound 116 may also have sloped or curved sidewalls. The sloped/curved sidewalls of molding compound 116 may be connected to a bottom surface of molding compound 116. In another embodiment, molding compound 116 may not extend into recesses 172.

Figure 5:
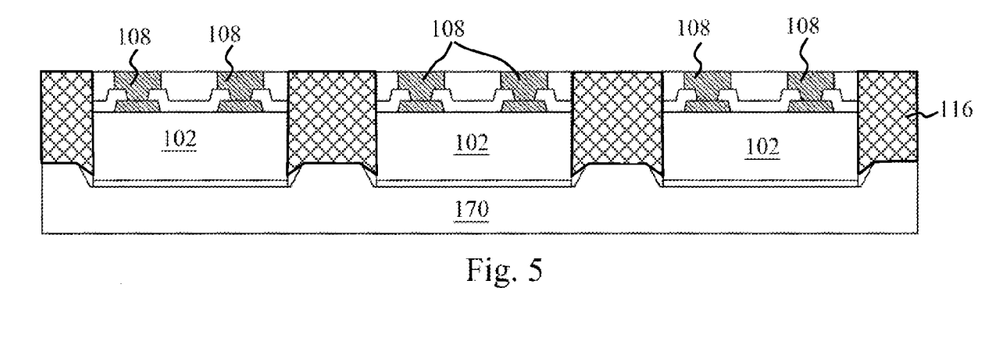

Molding compound 116 may be formed to initially extend over and cover top surfaces of dies 102. Next, in FIG. 5, a planarization process (e.g., a mechanical grinding, chemical mechanical polish (CMP), or other etch back technique) may be employed to remove excess portions of molding compound 116 over dies 102. After planarization, connectors (e.g., conductive pillars 108) of dies 102 are exposed, and top surfaces of molding compound 116 and die 102 may be substantially level.

Figure 6:
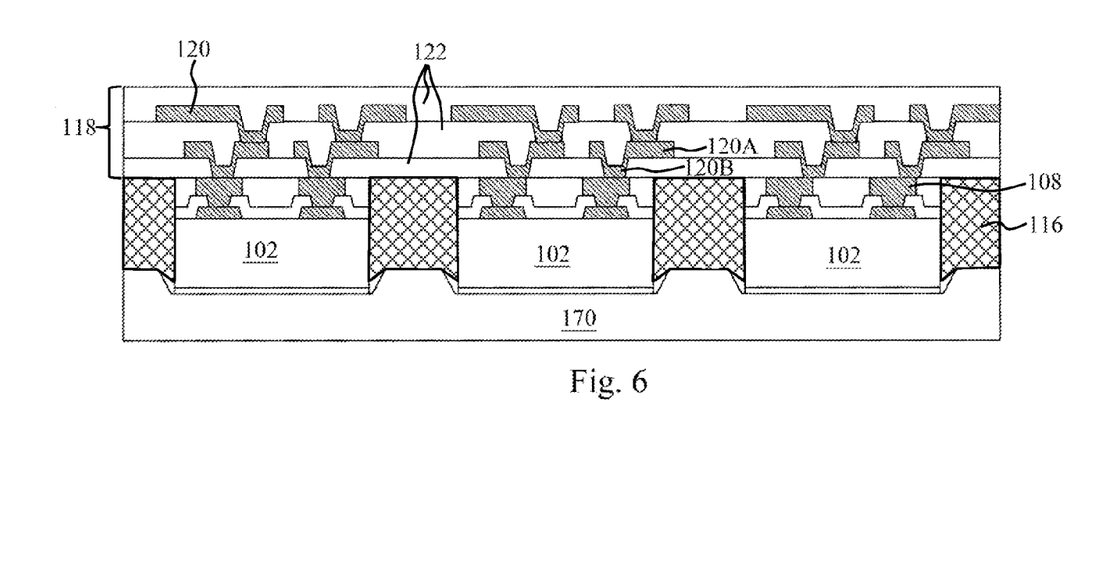

FIG. 6 illustrates the formation of RDLs 118 over molding compound 116 and dies 102. RDLs 118 may extend laterally past edges of dies 102 over a top surface of molding compound 116. RDLs 118 may include conductive features 120 formed in one or more polymer layers 122. Polymer layers 122 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, lamination, and the like.

Conductive features 120 (e.g., conductive lines 120A and/or vias 120B) may be formed in polymer layers 122 and electrically connect to dies 102 (e.g., through conductive pillars 108). The formation of conductive features 120 may include patterning polymer layers 122 (e.g., using a combination of photolithography and etching processes) and forming conductive features over and in the patterned polymer layer. The formation of conductive features 120 may include depositing a seed layer (not shown), using a mask layer (not shown) having various openings to define the shape of conductive features 120, and filling the openings in the mask layer using an electro-chemical plating process, for example. The mask layer and excess portions of the seed layer may then be removed. Thus, RDLs 118 are formed over dies 102 and molding compound 116. The number of polymer layers and conductive features of RDLs 118 is not limited to the illustrated embodiment of FIG. 6. For example, RDLs 118 may include any number of stacked, electrically connected conductive features in multiple polymer layers. Because dies 102 are secured by recesses 172 in carrier 170 during molding, lateral shifting of dies 102 is reduced. Thus, alignment between conductive features 120 and connectors (e.g., conductive pillars 108) of dies 102 may be improved. Improved alignment may also allow for the finer pitched conductive features 120.

Figure 7:
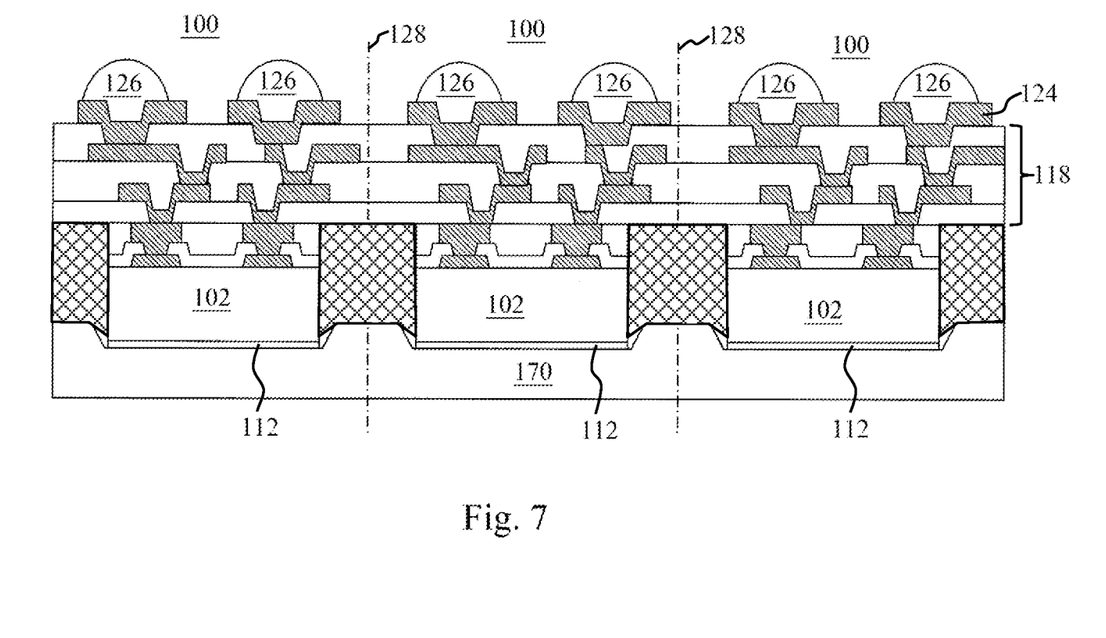

In FIG. 7, additional package features, such as external connectors 126 (e.g., BGA balls, C4 bumps, and the like) may be formed over RDLs 118. Connectors 126 may be disposed on UBMs 124, which may also be formed over RDLs 118.

Connectors 126 may be electrically connected to dies 102 by way of RDLs 118. Connectors 126 may be used to electrically connect package 100 to other package components such as another device die, interposers, package substrates, printed circuit boards, a mother board, and the like. Subsequently, carrier 170 may be removed and each package 100 (including die 102, corresponding portions of RDLs 118, UBMs 124, and connectors 126) may be singulated along scribe lines 128 using a suitable die saw technique. For example, in an embodiment where DAF 112 is an UV glue, carrier 170 may be removed by exposing DAF 112 to UV light.

FIG. 8 illustrates the completed package 100 after singulation. Package 100 includes a die 102, a molding compound 116 surrounding a portion of die 102, fan-out RDLs 118 electrically connected to die 102, and external connectors 126. After carrier 170 is removed, die 102 extends past a bottom lateral surface 116B of molding compound 116 by a thickness T5. In some embodiments, thickness T5 maybe about 20% to about 50% of a total thickness T1 of die 102. For example, in an embodiment, a portion 102A of die 102 extending past molding compound 116 may have a thickness of about 100 µm while a portion 102B of die 102 surrounded by molding compound 116 may have a thickness of about 350 µm. Portion 102A of die 102 may correspond to a portion of die 102 previously disposed within recess 172 of carrier 170. It has been observed that by when dimensions of portion 102A of die 102 extending past molding compound 116 is in the above range, improved heat dissipation can be achieved in package 100. Furthermore, less molding compound may be used in package 100 because molding compound 116 is not formed around a bottom portion 102A of die 102. Thus, CTE mismatch and warpage in package 100 may be advantageously reduced.

Figure 9:
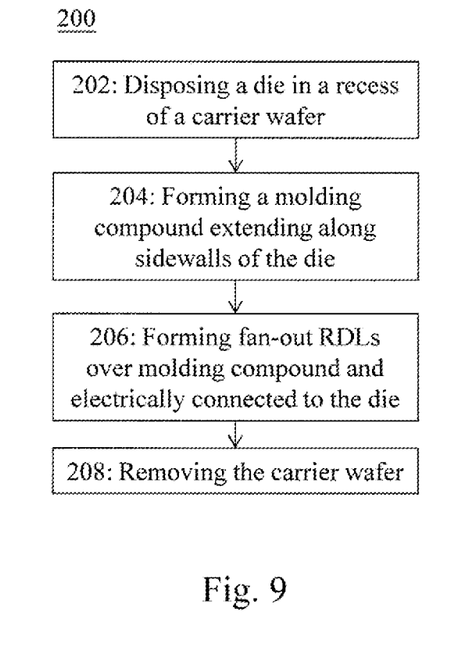
FIG. 9 illustrate a process flow for manufacturing a semiconductor device in accordance with some embodiments.

FIG. 9 illustrates a process flow 200 for forming a device package in accordance with various embodiments. In step 202, a die (e.g., die 102) is disposed at least partially within a recess (e.g., recess 172) of a carrier (e.g., carrier 170). Dimensions of the recess may be configured based on dimensions of the die. For example, in a top down view, the recess may be large enough to extend past the die in all directions by about 5 µm or less. In step 204, a molding compound (e.g., molding compound 116) is formed around the die. The recess in the carrier may be used to secure the die during the molding process to reduce undesired, lateral shifting of the die. The molding compound may extend along sidewalls of the die, and in some embodiments, the molding compound may even extend into the recess. However, due to the similarity in footprints of the recess and the die, the molding compound may only extend partially into the recess, and a bottom surface of the die may still be lower than bottom surface of the molding compound. In step 206, various fan-out RDLs (e.g., RDLs 118) are formed over the molding compound and the die. The fan-out RDLs may be electrically connected to the die, and the molding compound may provide lateral surfaces for supporting portions of the fan-out RDLs extending past edges of the die. Because the die is secured by the recess during molding, alignment between the fan-out RDLs and the die may be advantageously improved. In step 208, the carrier is removed. In the resulting package, the die may extend past a bottom surface of the molding compound. For example, about 20% to about 50% of a total thickness of the die may extend past a bottom lateral surface of the molding compound. By extending a portion of the die past the molding compound, improved thermal dissipation may be achieved in the resulting device. Furthermore, less molding compound is used in the package, which allows for reduced CTE mismatch and reduced warpage.

Various embodiments include using a carrier having recesses for supporting semiconductor device dies while forming package features. During processing, each die is disposed within and secured by a recess, which may be configured based on a dimension of the die. The use of a patterned carrier and the resulting package structure may provide various non-limiting advantages. For example, each recess in the patterned carrier may have similar dimensions as a device die in a plan view. By using the recesses to help maintain a position of the device dies during molding, die shifting during the molding process may be reduced. Thus, alignment between the dies and subsequently formed RDLs can be improved, which reduces manufacturing defects as well as allows for RDL designs having smaller buffer dimensions and finer pitch. Additionally, less molding compound may be dispensed to form the device package, which allows for reduced coefficient of thermal expansion (CTE) mismatch and warpage in the resulting package. Furthermore, by extending bottom surfaces of the dies past a bottom surface of the molding compound, improved heat dissipation in the resulting packaged device can be achieved.

In accordance with an embodiment, a method includes providing a carrier having a recess and attaching a die to the carrier, wherein the die is at least partially disposed in the recess. The method further includes forming a molding compound over the carrier and around at least a portion of the die, forming fan-out redistribution layers over the molding compound and electrically connected to the die, and removing the carrier.

In accordance with another embodiment, a method includes attaching a die to a bottom surface of a recess within a carrier and forming a molding compound extending along sidewalls of the die while the die is attached to the bottom surface of the recess. A size of the recess is in accordance with a size of the die. The method further includes forming a fan-out redistribution layer (RDL) over the die and the molding compound, forming an external connector over the fan-out RDL, and removing the carrier. The fan-out RDL electrically connects the external connector to the die.

In accordance with an embodiment, a package includes a die and a molding compound surrounding a first portion of the die. A second portion of the die extends past a bottom surface of the molding compound. The package further includes a fan-out redistribution layer (RDL) over the die and a top surface of the molding compound and an external connector over the fan-out RDL. The external connector is electrically connected to the die by the fan-out RDL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a carrier comprising a recess;
attaching a die to the carrier, wherein the die is partially disposed in the recess and extends higher than the recess;
forming a molding compound over the carrier and around at least a portion of the die;
forming fan-out redistribution layers (RDLs) over the molding compound and electrically connected to the die; and
removing the carrier.

2. The method of claim 1, wherein attaching the die to the carrier comprises attaching a bottom surface of the die to a bottom surface of the recess using a die attach film.

3. The method of claim 1, wherein a size of the recess is in accordance with a size of the die.

4. The method of claim 3, wherein the size of the recess is greater than the size of the die by about 5 μm or less in all directions of a top-down view.

5. The method of claim 1, wherein sidewalls of the recess are sloped, and wherein attaching the die to the carrier comprises a self-alignment process.

6. The method of claim 1, wherein forming the molding compound comprises forming a portion of the molding compound in the recess.

7. The method of claim 1, wherein forming the molding compound comprises a transfer molding process, a compressive molding process, or a combination thereof or the like.

8. The method of claim 1, wherein forming the molding compound comprises securing the die in the recess while forming the molding compound.

9. A method for forming a semiconductor package comprising:
attaching a die to a bottom surface of a recess within a carrier, wherein a size of the recess is in accordance with a size of the die;
forming a molding compound extending along sidewalls of the die while the die is attached to the bottom surface of the recess, wherein forming the molding compound comprises disposing a portion of the molding compound in a recess, and wherein a gap is disposed between a bottom surface of the portion of the molding compound in the recess and the bottom surface of the recess;
forming a fan-out redistribution layer (RDL) over the die and the molding compound;
forming an external connector over the fan-out RDL, wherein the fan-out RDL electrically connects the external connector to the die; and
removing the carrier.

10. The method of claim 9, wherein a difference between a width of the bottom surface of the recess and a width of the die is about 10 μm or less.

11. The method of claim 9, wherein a depth of the recess is about 20 percent to about 50 percent of a thickness of the die.

12. The method of claim 9, wherein a sidewall of the recess is sloped, and wherein attaching the die to the bottom surface of the recess comprising:
positioning the die over the recess using a bond head;
lowering the die into the recess; and
sliding the die laterally onto the bottom surface the recess using a self-alignment process.

13. The method of claim 12, wherein an angle defined by the sidewall of the recess and the bottom surface of the recess is about 45°.

14. The method of claim 12 further comprising patterning the carrier to form the recess using etching, laser ablation, or a combination thereof.

15. A package comprising:
a die;
a molding compound surrounding a first portion of the die, wherein a second portion of the die extends below a bottommost surface of the molding compound;
a fan-out redistribution layer (RDL) over the die and a top surface of the molding compound; and
an external connector over the fan-out RDL, wherein the external connector is electrically connected to the die by the fan-out RDL.

16. The package of claim 15, wherein a thickness of the second portion of the die is about 20 percent to about 50 percent of a total thickness of the die.

17. The package of claim 15, wherein at least a portion of the molding compound comprises a sloped or curved sidewall.

18. The package of claim 17, wherein the sloped or curved sidewall is connected to the bottommost surface of the molding compound.

19. The package of claim 15, wherein the molding compound comprises epoxy resin, phenol resin, a thermally-set resin, or a combination thereof.

20. The package of claim 19, wherein the molding compound further comprises an additive filler.

* * * * *